United States Patent [19]

Yokoyama

[11] 4,057,764

[45] Nov. 8, 1977

[54] AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 667,443

[22] Filed: Mar. 16, 1976

[30] Foreign Application Priority Data

Mar. 19, 1975 Japan .................................. 50-36733

[51] Int. Cl.² ............................................... H03F 3/04
[52] U.S. Cl. ..................................... 330/264; 307/81; 330/267
[58] Field of Search ...................... 307/80, 81; 330/13, 330/15, 22, 35, 40

[56] References Cited

U.S. PATENT DOCUMENTS

| 3,227,889 | 1/1966 | Paynter | 307/81 |
| 3,319,175 | 5/1967 | Dryden | 330/22 |
| 3,921,089 | 11/1975 | Tsurushima | 330/22 |

Primary Examiner—Lawrence J. Dahl
Attorney, Agent, or Firm—Cushman, Darby & Cushman

[57] ABSTRACT

An amplifier comprises a power amplifying circuit including FET's and operable when supplied with a first power source and a drive circuit operable when supplied with a second power source for driving the power amplifying circuit and including a bias circuit for providing bias voltages for the FET's. Upon turning on the power switch, the first power source builds up quickly while the second power source builds up with some time delay. Switch-over circuits connect the power lines of the drive circuit to the first power source initially and to the second power source after the build-up of the latter, thereby starting the supply of the bias voltages to the FET's at the build up of the first power source to prevent an excessively large current or rush current from flowing through the FET's, thus avoiding the breakage or characteristic deterioration of the FET's.

4 Claims, 3 Drawing Figures

AMPLIFIER

BACKGROUND OF THE INVENTION a. Field of the invention

The present invention pertains to an amplifier, and more particularly it relates to an amplifier designed so that no excessively large rush current flows to the FET of its power amplifying circuit at the time of starting this amplifier, i.e. when this amplifier is connected to a power source.

b. Description of the prior art

Recently, there has been the tendency that field effect transistors (hereinafter to be referred to as FET's) are preferably employed as the power amplifying element in the power amplifying circuit of an amplifier instead of bipolar transistors. In its zero bias state, the bipolar transistor is kept nonconductive even when a voltage is applied between its collector and emitter circuits. An FET, on the other hand, has the nature that, whenever a voltage is applied between its drain and source electrodes, there flows a drain current in the zero bias state of the FET.

As a result, in an amplifier in which is employed FET's as its power amplifying elements, it should be noted that there flows an excessively large current through the FET's at the time the amplifier is put to work, i.e. when the amplifier is connected to a power source, and that, accordingly, there could often arise problems such that the FET's are broken or the characteristics of the FET's become deteriorated. Such problems would most frequently arise where an amplifier is of the type that the power amplifying circuit and the drive circuit of the amplifier are operated by separate power sources, respectively.

These inconveniences of the prior art will hereunder be described in further detail by referring to FIG. 1 which depicts a conventional type amplifier.

In FIG. 1, the FET's Q12 and Q13 of a power amplifying circuit are of the so-called single-ended push-pull configuration. The drain electrodes of these FET's Q12 and Q13 are connected to a first positive power source +EC1 and to a first negative power source −EC1, respectively. Also, the commonly connected sources of the FET's Q12 and Q13 are connected to a load RL. A bipolar transistor Tr11 constitutes the drive circuit for driving the FET's Q12 and Q13 of the amplifying circuit. The emitter circuit of this bipolar transistor Tr11 is connected to a second negative power source −EC2. The collector circuit of the bipolar transistor Tr11 is connected to a second positive power source +EC2 via resistors R11 and R12. This drive circuit includes a bias circuit for generating the gate-bias voltages of the FET's Q12 and Q13 of the power amplifying circuit. The voltages produced at the opposite terminals of the resistor R11 are supplied to the gates of the FET's Q12 and Q13 as the bias voltages.

The output voltages of the second positive power source +EC2 and the second negative power source −EC2 normally are stabilized so that these stabilized output voltages serve to eliminate the bias fluctuations of the FET's Q12 and Q13 and the ripple effect of the power sources. Accordingly, the second positive power source +EC2 and the second negative power source −EC2 are such that, when these two power sources are put to operation, their output voltages do not quickly rise to a predetermined value. A relatively lengthy period of time is consumed before these output voltages gain the predetermined value. On the other hand, it is usual that the output voltages of the first positive power source +EC1 and the first negative power source −EC1 reach a predetermined value in a relatively short period of time after they are put to operation. For this reason, in the stage of the amplifier immediately after the amplifier is started, there is immediately applied a predetermined voltage between the drain and source electrodes of the FET's Q12 and Q13 of the power amplifying circuit. However, the build-up of the output voltages of the second positive power source +EC2 and the second negative power source −EC2 are delayed so that the drive circuit is not applied with a predetermined voltage. Accordingly, the FET's Q12 and Q13 are given substantially a zero gate bias state. As a result, there will flow an excessively large or rush current to the FET's Q12 and Q13 which are usually of a depletion mode. When this excessively large or rush current flows to these FET's they are heated up and may be destroyed or the heating of these FET's may cause deterioration of the FET's Q12 and Q13.

SUMMARY OF THE INVENTION

It is, therefore, a primary object of the present invention to provide an amplifier which employs an FET as the power amplifying element and in which the FET is neither broken nor deteriorated during an extended period of use.

Another object of the present invention is to provide an amplifier of the type described, which inhibits the flow of an excessively large or rush current to the FET which serves as the power amplifying element, at the time that this amplifier is put to work, i.e. when it is connected to a power source.

Still another object of the present invention is to provide an amplifier of the type described above, which is arranged so that its power amplifying circuit and drive circuit are connected separately to different operation power sources.

An amplifier according to the present invention comprises; a power amplifying circuit including at least one FET and operable when supplied with a first power source; a drive circuit operable when supplied with a second power source for driving the power amplifying circuit and including a bias circuit for providing bias voltages for the FET and a switch-over circuit. Upon turning on the power switch, the first power source builds up quickly whilst the second power source builds up with some time delay. The switch-over circuit connects the power lines of the drive circuit to the first power source initially and to the second power source after the build-up of the latter, thereby starting the supply of the bias voltages to the FET at the build up of the first power source to prevent an excessive large rush current from flowing through the FET, thus avoiding the breakage or characteristic deterioration of the FET.

The amplifier of the present invention which has been described above is such that can have a push-pull circuit arrangement as well as a single-circuit arrangement. Also, the above-mentioned switch-over circuit may be formed, most simply, with a pair of diodes.

These and other objects as well as the features and advantages of the present invention will become apparent by reading the following detailed explanation when taken in conjunction with the accompanying drawings.

DETAILED DESCRIPTION OF THE PREFERRED EMBODIMENTS

Figure 1:
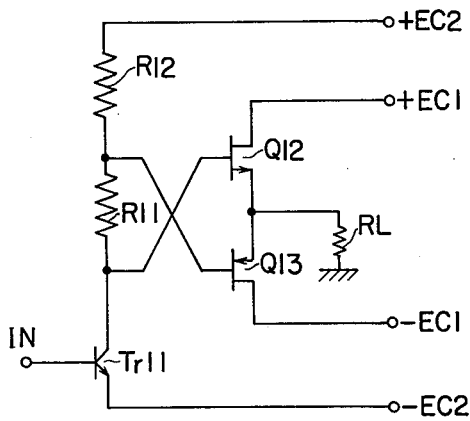
FIG. 1 is a circuit diagram showing a known amplifier.
Figure 2:
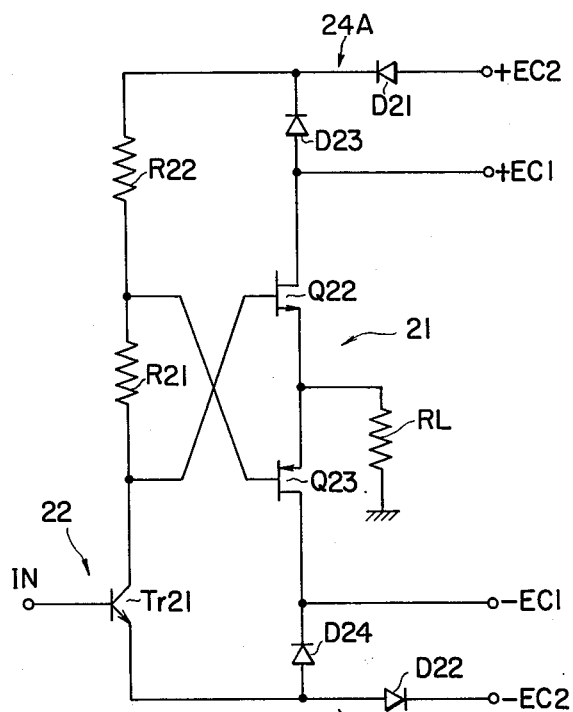
FIG. 2 is a circuit diagram showing a basic example of the amplifier of the present invention.

Referring now to FIG. 2, an example of the amplifier according to the present invention will hereunder be described. An N-channel FET Q22 and a P-channel FET Q23 of a power amplifying circuit 21 are of the so-called single-ended push-pull configuration. The source electrodes of these two FET's Q22 and Q23 are connected in common and are grounded via a load resistor RL. The drain electrodes of these FET's Q22 and Q23 are connected to a first positive power source +EC1 and to a first negative power source +EC1, respectively. The absolute values of the output voltages of these two power sources +EC1 and −EC1 are identical with each other.

The drive circuit for driving the FET's Q22 and Q23 of the power amplifying circuit 21 includes an NPN-type bipolar transistor Tr21. The emitter circuit of this bipolar transistor Tr21 is connected via a diode D22 to a second negative power source −EC2, and further is connected via a diode D24 to said first negative power source −EC1. Also, the collector circuit of the transistor Tr21 is connected via two diodes D21 and D23 to said second positive power source +EC2 and also to a first positive power source +EC1, respectively. The absolute values of the output voltages of said second power sources +EC2 and −EC2 are identical with each other. Also, the absolute values of the output voltages of said second power sources +EC2 and −EC2 are greater than those of the first power sources +EC1 and −EC1. Furthermore, the output voltages of these second power sources +EC2 and −EC2 are stabilized by a voltage stabilizing circuit not shown. Also, these output voltages hardly contain ripple components, i.e., contain very little if any ripples (a.c. components).

Said drive circuit 22 concurrently serves as a circuit for generating the gate bias voltages of the FET's Q22 and Q23 of the power amplifying circuit 21. The opposite terminal voltages of a resistor R21 are supplied, as the gate bias voltages, to the gates of the FET's Q22 and Q23. Arrangement is provided so that, in case no signal is inputted to the base circuit of the transistor Tr21 of the drive circuit 22, the potentials at the opposite terminals of the resistor R21 will have the opposite polarities, and the absolute values of the output voltages at these two terminals are equal to each other.

Said diodes D21 and D23 and the diodes D22 and D24 constitute automatic switch-over circuits 24A and 24B, respectively. In case the output voltage of the second positive power source +EC2 is higher than the output voltage of the first positive power source +EC1, the diode D21 of the switch-over circuit 24A is rendered conductive, whereas the diode D23 is rendered non-conductive. Thus, the output voltage of the second positive power source +EC2 is applied to the drive circuit 22. More particularly, in the normal operation state of the amplifier, a stabilized output-voltage of the second positive power source +EC2 is applied to the drive circuit 22. Similarly, in such a normal operation state, the diode D22 of the switch-over circuit 24B is rendered conductive while the diode D24 is rendered non-conductive. Thus, the stabilized output voltage of the second negative power source −EC2 is applied to the drive circuit 22.

In the period immediately after the starting of the amplifier, in which the output voltages of the second power sources +EC2 and −EC2 have not undergone a sufficient rise and in which the output voltages of the second power sources +EC2 and −EC2 are lower in their absolute values than those of the first power sources +EC1 and −EC1, the diodes D23 and D24 of the respective switch-over circuits 24A and 24B are rendered conductive, and thus the output voltages of the first power sources +EC1 and −EC1 are applied also to the drive circuit 22. It should be understood that, since the diodes D21 and D22 of the switch-over circuits 24A and 24B are in the cut-off state, no current will flow from the first power sources +EC1 and −EC1 to the second power sources +EC2 and −EC2.

As discussed above, in the stage immediately after the starting of the amplifier, the first power sources +EC1 and −EC1 are connected also to the drive circuit 22 via the switch-over circuits 24A and 24B, never does the instance arise wherein there no reverse is applied bias between the gate and source electrodes of the FET's Q22 and Q23 of the power amplifying circuit. Accordingly, the flow of an excessively large or rush current to the FET's Q22 and Q23 is prevented.

Also, after the output voltages of the second power sources +EC2 and −EC2 have risen up to the normal values (predetermined values), the second power sources +EC2 and −EC2 are connected via the switch-over circuits 24A and 24B to the drive circuit 22. Thus, there are developed, at the opposite terminals of the resistor R21 of the drive circuit 22, the required normal gate bias voltages for the FET's Q22 and Q23.

The switch-over circuits 24A and 24B which are constituted by the diodes D21 - D24 are of simple constructions, and are advantageous accordingly. It is needless to say that the arrangement of these switch-over circuit may be varied as desired.

Figure 3:
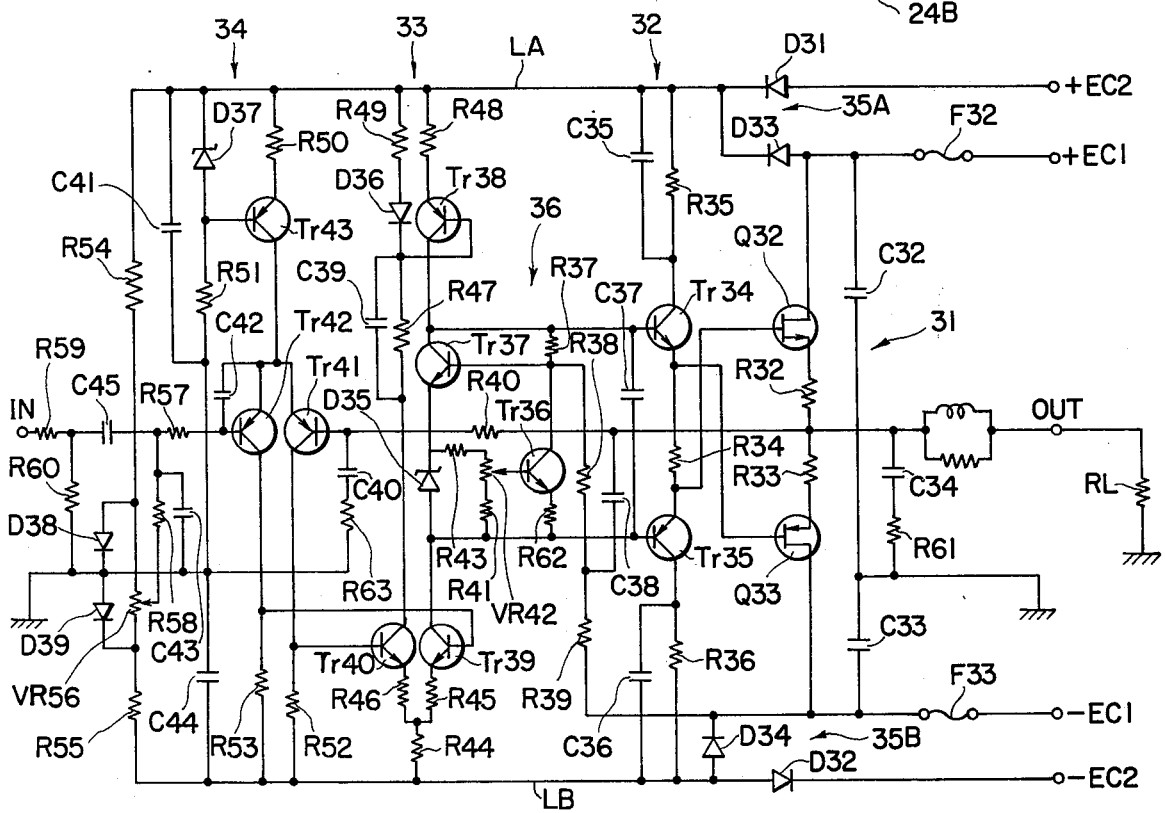
FIG. 3 is a circuit diagram showing another example of the amplifier of the present invention.

Another example of the amplifier according to the present invention is shown in FIG. 3. This example is intended to prevent the flow of an excessively large current to the FET's of the power amplifying circuit, and also to stabilize the operating points of these FET's with respect to the ambient temperature and to the fluctuations in the voltage of the power sources.

The amplifier of this example comprises a power amplifying circuit 31, a buffer circuit 32, a drive circuit 33 including a bias circuit 36, and a pre-drive circuit 34. The signal which is inputted to an input terminal IN is amplified by the predrive circuit 34 and the drive circuit 33, and via the buffer circuit 32 it is fed to the power amplifying circuit 31 where it is power-amplified, and is outputted at an output terminal OUT.

The power amplifying circuit 31 includes an N-channel type FET Q32 and a P-channel type FET Q33. The source electrodes of these FET's Q32 and Q33 are connected to each other via resistors R32 and R33, to be commonly connected to the output terminal OUT. The drain electrodes of the FET's Q32 and Q33, on the other hand, are connected to a first positive power source +EC1 and a first negative power source −EC1, via fuses F32 and F33, respectively.

The drive circuit 33 comprises: a differential amplifier consisting of transistors Tr39 and Tr40 and resistors R44, R45 and R46; a load circuit of said differential amplifier consisting of a transistor Tr38, a diode D36, resistors R47, R48 and R49 and a capacitor C39; and said bias circuit 36 consisting of transistors Tr37 and Tr36, a zener diode ZD35, resistors R37, R38, R39, R40, R41, R43 and R62, a potentiometer VR42 and capacitors C36, C37 and C38.

To the resistor R37 of the bias circuit 36 is supplied a constant current which is sufficiently larger than the base current of the transistor Tr36 by the transistor Tr36 which constitutes a constant current circuit. Whereby, a sufficiently larger voltage drop than the base-emitter voltage of the transistor Tr36 is developed across the opposite terminals of the resistor R37. Accordingly, the collector-emitter voltage of the transistor Tr37 is rendered constant without being affected by the ambient temperature. In view of the fact that the voltage across the opposite terminals of the zener diode ZD35 is substantially constant independently of the ambient temperature, the voltage between the collector circuit of the transistor Tr37 and the anode of the zener diode ZD35 is held constant. This latter constant voltage is applied to the gate electrodes of the FET's Q32 and Q33 of the power amplifying circuit 31 via the transistors Tr34 and Tr35 of the buffer circuit 32.

Also, in order to prevent the fluctuations of the operating points of the FET's Q32 and Q33 caused by the fluctuations in the output voltages of the first power sources +EC1 and −EC1, the voltage fluctuations of the first negative power source −EC1 are applied to the base circuit of the transistor Tr37 of the bias circuit 36. For example, in case the FET's Q32 and Q33 are non-saturation type FET's having a triode-like characteristic, the output voltage fluctuation $\Delta V_{DS}$ of the first power sources +EC1 and −EC1 will bring about a fluctuation of the operating point of the drain current in an amount equivalent to such an amount as would be caused by the fluctuation in the gate bias voltages of the FET's Q32 and Q33 in an amount ($\Delta V_{DS}/\mu$). In the above-mentioned format, $\mu$ represents the voltage amplification factor of the FET's Q32 and Q33. As such, if the resistance ratio between the resistor R37 and the resistors R38, R39 is set so as to cancel the above-mentioned equivalent fluctuation amount ($\Delta V_{DS}/\mu$) of said gate bias voltage, it is possible to prevent the fluctuations of the operating point of the drain current of the FET's Q32 and Q33 caused by the fluctuations in the output voltages of the first power sources +EC1 and −EC1.

The emitter circuits of the transistors Tr34 and Tr35 of the buffer circuit 32 are connected to each other via resistor R34. The collector circuits of these transistors are connected to the power supply lines LA and LB of the drive circuit 33 via resistors R35, R36 and capacitors C35, C36, respectively.

The pre-drive circuit 34 includes transistors Tr41 and Tr42 which constitute a differential amplifier circuit. The collector circuits of these transistors Tr41 and Tr42 are connected to said power supply line LB via resistors R53 and R52, respectively. Also, the emitter circuits of these transistors Tr41 and Tr42 are connected to the power supply line LA via a constant current circuit which is formed with a transistor Tr43, a zener diode ZD37, resistors R50 and R51 and a capacitor C41. To the base circuit of the transistor Tr41 is negative fed back the output signal of the amplifier via a feedback network which is composed of resistors R40 and R63 and a capacitor C40. To the base circuit of the transistor Tr42 is applied an input signal via an input network which is comprised of resistors R57, R59, R60 and a capacitor C45, and is also applied a base bias voltage by a bias circuit which is formed with resistors R54, R55, R58, diodes D38, D39, and a capacitor C43 and a potentiometer VR56.

The first positive power source +EC1 and a second positive power source +EC2 are connected to said power supply line LA via the diodes D31 and D33 of a switch-over circuit 35A. Also, the first negative power source −EC1 and a second negative power source −EC2 are connected to said power supply line LB via the diodes D32 and D34 of a switch-over circuit 35B. The actions of these switch-over circuits 35A and 35B are similar to those of the switch-over circuits 24A and 24B shown in FIG. 2. Symbols C32, C33, C34 and C42 represent capacitors and R61 represents a resistor.

The descriptions of the embodiments of the present invention made above concern push-pull circuit arrangements. Needless to say, the present invention may be equally effectively applied to an amplifier of single-circuit arrangement.

I claim:
1. An amplifier comprising:
   a first power source building up quickly upon power-on of the amplifier;
   a second power source building up with a time delay as compared with said first power source upon power-on of the amplifier;
   a power amplifying circuit connected to said first power source and including at least one FET;
   a drive circuit connected to said power amplifying circuit for driving the latter, and including means for providing at least one bias voltage for said at least one FET; and
   switch-over means connected to said drive circuit, said first power source and said second power source for supplying, to said drive circuit, power from said first power source before said second power source builds up and power from said second power source after said second power source builds up.

2. An amplifier according to claim 1, wherein:
   said FET is of a depletion mode.

3. An amplifier according to claim 1, wherein:
   said power amplifying circuit is of a push-pull arrangement.

4. An amplifier according to claim 1, wherein:
   said first power source provides a first power voltage, said second power source provides a second power voltage higher than said first power voltage, and said switch-over means includes diodes connected between said second power source and said drive circuit and between said first power source and said drive circuit both in the forward direction with respect to power source currents through said drive circuit.

* * * * *